United States Patent
Gider et al.

(10) Patent No.: US 6,791,868 B2
(45) Date of Patent: Sep. 14, 2004

(54) FERROMAGNETIC RESONANCE SWITCHING FOR MAGNETIC RANDOM ACCESS MEMORY

(75) Inventors: Savas Gider, San Jose, CA (US); Vladimir Nikitin, Campbell, CA (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 10/335,671

(22) Filed: Jan. 2, 2003

(65) Prior Publication Data

US 2004/0130935 A1 Jul. 8, 2004

(51) Int. Cl.$^7$ ............................................... G11C 11/00
(52) U.S. Cl. .................. 365/158; 365/171; 365/189.09; 365/199
(58) Field of Search ................................. 365/158, 171, 365/189.01, 189.09, 199

(56) References Cited

U.S. PATENT DOCUMENTS

| | | | |
|---|---|---|---|
| 5,748,519 A | 5/1998 | Tehrani et al. | ................. 365/98 |
| 5,793,697 A | 8/1998 | Scheuerlein | ........... 365/230.07 |
| 5,966,012 A | 10/1999 | Parkin | ......................... 324/252 |
| 6,097,625 A | 8/2000 | Scheuerlein | ................. 365/171 |
| 6,163,477 A | 12/2000 | Tran | ............................. 365/173 |
| 6,166,948 A | 12/2000 | Parkin et al. | ................ 365/173 |
| 6,178,131 B1 | 1/2001 | Ishikawa et al. | .......... 365/225.7 |
| 6,188,615 B1 | 2/2001 | Perner et al. | .......... 365/189.01 |
| 6,191,972 B1 | 2/2001 | Miura et al. | ................. 365/171 |
| 6,335,890 B1 | 1/2002 | Reohr et al. | ............. 365/225.5 |

Primary Examiner—Van Thu Nguyen
(74) Attorney, Agent, or Firm—Ron Feece

(57) ABSTRACT

A new method of performing the write operation on the MRAM bit cell with improved switching selectivity and lower write current requirements is achieved utilizing oscillating word write currents at frequency near the ferromagnetic resonance frequency of the free layer, combined with the shift in said frequency due to the magnetic field produced by the current in the bit line. Operation is implemented in a conventional magnetic random access memory having a plurality of magnetoresisitive cells formed by an intersection of a grid of word and bit lines, wherein an individual cell within the grid can be selected and switched from one magnetic state to another by the magnetic fields produced by the currents in the word and bit lines.

17 Claims, 7 Drawing Sheets

FERROMAGNETIC RESONANCE SWITCHING FOR MAGNETIC RANDOM ACCESS MEMORY

BACKGROUND OF THE INVENTION

1. Field of the Invention

The present invention relates to magnetic random access memory, and more particularly to the efficient selection and switching of a magnetic element within a magnetic random access memory array.

2. Background Art

The desired characteristics for computer memory are high speed, low power consumption, non-volatility, high data density and low cost. Dynamic Random Access Memory (DRAM) cells are fast and expend little power, but have to be refreshed many times each second and require complex structures which can make them relatively expensive. Flash type EEPROM cells are nonvolatile, have low sensing power, and can be constructed as a single device, but take microseconds to write and milliseconds to erase, which makes them too slow for many applications, especially for use in computer memory. Conventional semiconductor memory cells such as DRAM, ROM, and EEPROM have current flow in the plane of the cell, i.e., "horizontal", and therefore occupy a total surface area that is the sum of the essential memory cell area plus the area for the electrical contact regions, and therefore do not achieve the theoretical minimum cell area Magnet Random Access Memory is a promising candidate for computer memory that can meet the above stated objectives while overcoming many of the limitations of the above described devices. The benefits of Magnetic Random Access Memory (MRAM) are discussed in "The Science and Technology of Magnetoresistive Tunneling Memory", IEEE Transactions on Nanotechnology, Vol. 1, No. 1, March 2002, by B. N. Engel et al. A Magnetic Random Access Memory is essentially a grid of electrically conductive bit lines and word lines. The bit lines are parallel to one another and are perpendicular to the word lines, which are also parallel with one another. A magnetoresistive cell, disposed at the intersection of each word and bit line, electrically connects a particular word line to a particular bit line. By applying a voltage across the magnetoresistive cell from the particular word line to the particular bit line, the magnetic resistance, and memory state, of the magnetoresistive cell can be determined. Although various types of magnetoresistive cells can potentially be used in a MRAM array, such as for example a Current Perpendicular to Plane Giant Magnetoresistance Element (CPP GMR), most development efforts have focused on the use of Tunnel Valves also known as Magnetic Tunnel Junction (MTJ) cells, due to their potential for high resistance change, $\delta R/R$. Therefore, while the state of the MRAM art will be described with reference to MTJ cells, it should be appreciated that many of the same principles and challenges apply to MRAM arrays incorporating other types of magnetoresistive cells as well.

A MTJ cell, in its most general sense includes first and second ferromagnetic layers separated by a thin insulating layer known as a tunnel barrier layer. One of the ferromagnetic layers has its magnetization pinned in a predetermined direction while the other is free to rotate under the influence of magnetic field. Quantum mechanical tunneling of electrons through the tunnel barrier layer is allowed or inhibited based on the relative alignments of the magnetization of the free and pinned magnetic layers. If the magnetization of the free layer is aligned parallel with that of the pinned layer, then electrons will tend to pass through the tunnel barrier layer; if the magnetizations of the two layers are anti-parallel, then electrons will not as easily pass. Furthermore, the MTJ is designed so that the magnetically free layer will have a magnetic anisotropy, which will cause the magnetization of the free layer to be most stable when in either of these two states, (ie. parallel or anti-parallel to the pinned layer). In this way, once the MTJ cell is placed in a particular magnetic state it will tend to remain there until acted on by a magnetic field, thus providing its non-volatility. Switching of the MTJ cell is generally accomplished by causing a current to flow through both of the word and bit lines.

The free layer of the cell at the intersection of the energized bit and word lines will undergo magnetization reversal, provided that the magnetic fields produced by the word and bit lines are sufficiently high. The Stoner-Wohlfarth coherent rotation model quite accurately describes the switching behavior of a typical free layer in the MRAM cell. According to the model, the switching will occur if the magnetic fields in the hard and easy axis directions lie outside of the so-called astroid curve, as shown in FIG. 4A. The operating currents are chosen such that they produce a magnetic field at the selected cell that satisfies the switching conditions for the cell, but not for any other cell along word or bit lines (i.e. the fields for non-selected bits have to lie within the astroid curve). However, the cells in the array do not have identical magnetic properties. Variations in the bit size, shape, aspect ratio, and crystalline anisotropy lead to a distribution of the switching fields. This leads to a problem regarding bit selectivity, i.e., for a given write current, some of the selected bits will switch, while others might not. Simply increasing the write current would allow switching of these hard-to-switch bits; however, some of the non-selected bits will switch with such large currents. This is illustrated in FIG. 4B. The inner and outer astroids ($A_{min}$ and $A_{max}$, respectively) show the extremes in the switching distributions of the free layer in the MRAM array. If the operating point O is chosen within $A_{max}$, then only cells within astroid A can be switched, while others outside astroid A cannot be addressed. To address these cells, the operating point has to be moved to point P outside of $A_{max}$. But in such a case, all the cells with distribution described by $A_{min}$ that lie along the selected word or bit lines, will be unintentionally switched.

Another factor that adversely affects bit selectivity, is the magnetic field produced by the neighboring cells. These fields can change the fields required to switch the selected bit at the chosen operating point or lead to unintentional switching of the non-selected bits. The problem of the bit selectivity is widely recognized in the field, and numerous solutions have been proposed, such as the use of thermally assisted writing as described in U.S. Pat. No. 6,385,082 by D. W. Abraham et al., the use of offset bit currents as described in U.S. Pat. No. 6,424,561 by Shaoping Le et al., and the use of magnetic bias as described in U.S. Pat. No. 6,163,477 by L. T. Tran. However, the proposed solutions generally compromise some other desirable aspects of MRAM, such as power consumption or areal density.

Another problem encountered in MRAM is the magnetic stability of the bits. As the size of the bits become smaller, they approach the superparamagnetic limit. To increase the stability, one solution requires increasing the magnetic anisotropy of the bits, but this also requires higher magnetic fields to switch the bits and in turn, requires larger power consumption.

SUMMARY OF THE INVENTION

The present invention allows a particular magnetoresistive cell within a MRAM array to be selected and switched with a minimum of power and also allows a particular cell to be selected for switching while leaving other adjacent cells unaffected. The invention takes advantage of the ferromagnetic resonance frequency of the cell. By applying a DC current to one of the lines connected to the cell, the resonance frequency of the cell is shifted. An AC signal is then applied to the other of the lines connected to the particular cell. This AC signal is generated at a frequency that is generally the same as the shifted resonance frequency of the selected cell and creates a magnetic field at that same frequency. This magnetic field causes the magnetization of the free layer to oscillate at its shifted resonance frequency, rendering it easily switched with a minimum of energy.

The present invention provides significant advantages over the prior art for at least a couple of reasons. First, according to one aspect of the invention, a selected magnetoresistive cell can be switched from one magnetic/resistance state to another with a minimum of input energy. As discussed with reference to the prior art, the MRAM array includes a grid made up of a set of parallel word lines and a set of parallel bit lines, the word lines and bit lines being generally perpendicular to one another. Each specific word line is connected with a specific bit line by a magnetoresistive cell. The magnetic state of the cell can be controlled by causing a current to flow through the word and bit lines associated with the selected cell. The currents generate magnetic fields, which act upon the magnetic moment of the free layer to rotate it from one direction to another. By applying an AC current to a word line at the ferromagnetic resonance frequency, the magnetizations of the cells along the word line are rotated by a larger angle than with a DC current of the same amplitude. Additionally, by applying a DC current to a bit line, the ferromagnetic resonance frequency is shifted for all cells along the bit line, thus allowing for greater selectivity of the cell at the intersection with the word line.

Second, according to another aspect of the invention the resonance frequency of the particular selected cell can be shifted so that, by applying the above described AC signal at this shifted frequency, the selected cell will oscillate at the resonance frequency resulting in large magnetization rotation while other adjacent cells whose resonance frequency has not been shifted will oscillate with a much smaller amplitude. Shifting of the resonance frequency of the selected cell can be accomplished by generating a current having a DC bias through a bit line. By way of example, a predetermined DC current can be applied to the bit line. This generates a magnetic field along the easy axis of the free layer which shifts the resonance frequency of the cells along the bit line as approximately described by the formula $$f_{FMR} = \frac{\gamma}{2\pi} \sqrt{4\pi M (H_{Keff} \pm H_{ext})},$$

where $\gamma$ is the gyromagnetic constant, M is the saturation magnetization of the free layer, $H_{Keff}$ is the effective anisotropy of the free layer, which can include both the crystalline anisotropy and the shape anisotropy, and Hext is the external field from the bit line. The above equation assumes that both the magnetization and the external field lie in the plane of the free layer and along the easy axis. The external field may be either parallel or antiparallel to the magnetization.

Then an AC current having a frequency that is essentially the same as the shifted resonance frequency of the selected cell can be applied to the word line associated with that cell, generating a magnetic field of the same frequency. It will be appreciated that, even though all of the cells on that word line will be exposed to the oscillating magnetic field, and all of the cells on the bit line will experience a constant magnetic field Hext, the cell at the intersection of the word and bit lines will have by far the largest magnetization rotation since it will be the only cell being driven at resonance.

For a fuller understanding of the nature and advantages of the present invention, reference should be made to the following detailed description taken together with the accompanying figures, wherein like reference numerals refer to like elements.

DETAILED DESCRIPTION OF THE PREFERRED EMBODIMENTS

Figure 1:
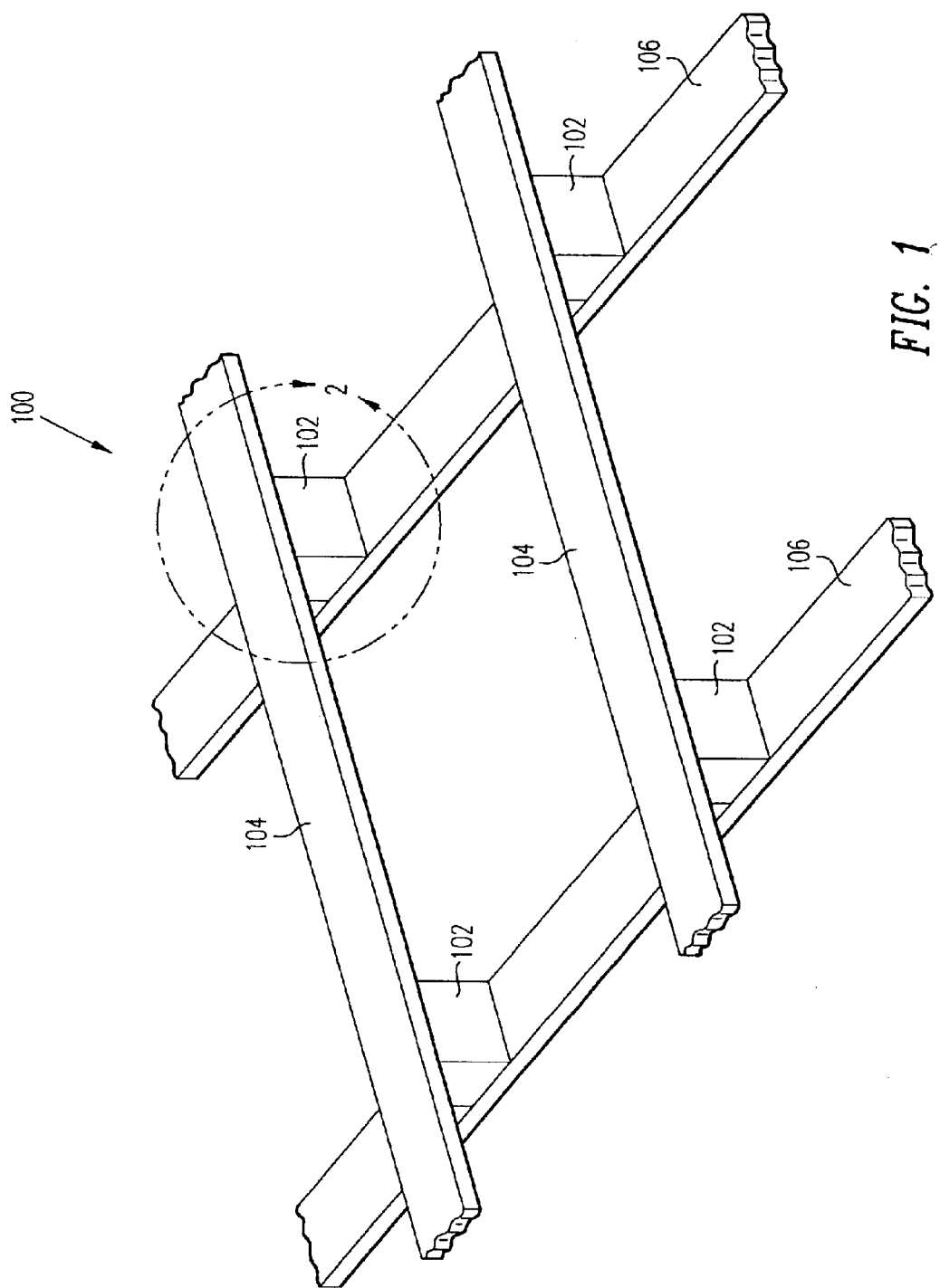
FIG. 1 is a perspective view, not to scale, of a portion of a MRAM array according to an embodiment of the invention.

FIG. 1 illustrates an exemplary Magnetic Random Access Memory (MRAM) array 100 according to a preferred embodiment of the invention. A plurality of magnetic tunnel junction (MTJ) cells 102 are provided at intersections of a rectangular grid of electrically conducive lines 104, 106. These electrically conductive lines include a set of conductive lines that function as parallel word lines 104, configured in a horizontal plane, and another set of parallel bit lines 106, arranged generally perpendicular to the word lines in another horizontal plane so that the word lines 104 and bit lines 106 form a grid and appear to intersect if viewed from above. Although two word lines 104 and two bit lines 106 are shown, one skilled in the art will recognize that the number of such lines would typically be much larger. A MTJ cell 102 is formed at each intersection of a word line 104 and a bit line 106 to vertically interconnect the word line with the bit line. The MTJ cell 102 can be switched between two possible resistance values, which define its binary memory state. During a sensing or reading operation of the array, a voltage is applied across the cell 102 between the word line 104 and bit line 106 corresponding to that MTJ cell 102, and the resistance value (i.e., memory state) is determined.

The vertical current path through the cell 102 permits the memory cell to occupy a very small surface area. While not shown in FIG. 2, the array may be formed on a substrate, such as silicon, which may contain other circuitry as well. In addition, an insulating material (also not shown) usually separates the word lines 104 and bit lines 106 in regions other than the intersecting regions.

Figure 2:
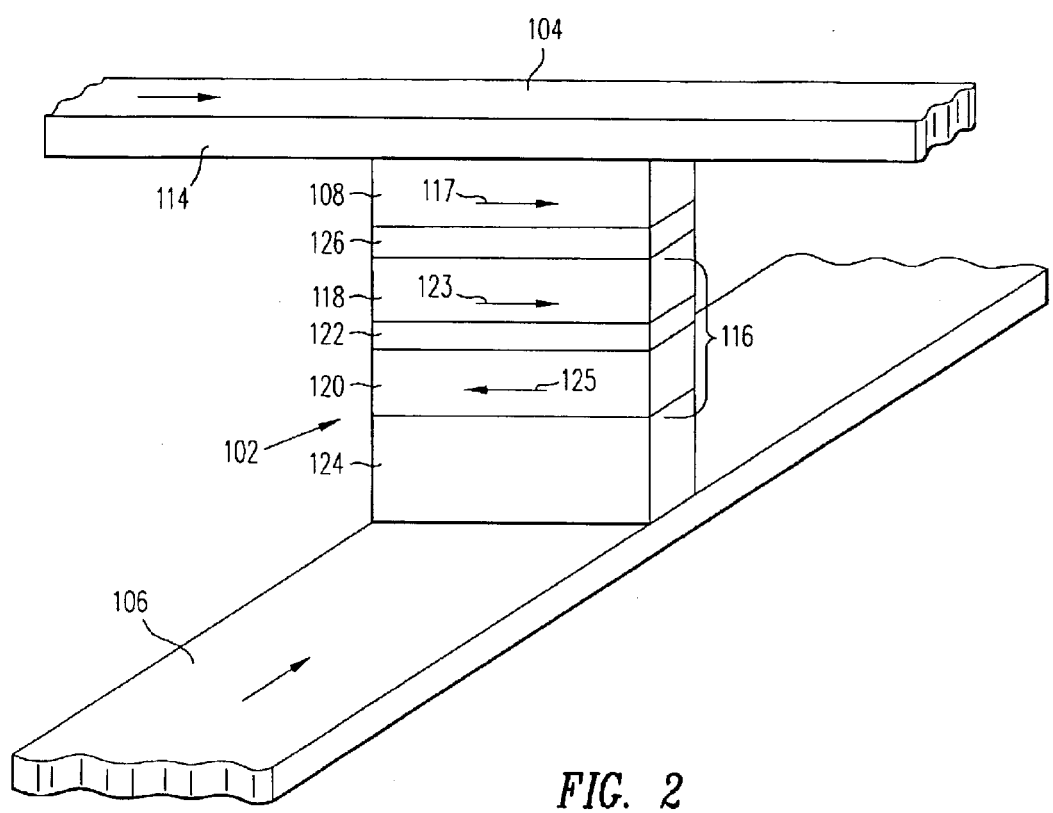
FIG. 2 is a view taken along circle 2 of FIG. 1 shown enlarged and not to scale.

With reference to FIG. 2, a MTJ cell 102 according to a preferred embodiment of the invention includes a free layer 108. The magnetic moment of the free layer 108 is indicated by arrow 117. The MTJ cell 102 also includes a magnetically pinned ferromagnetic layer 116. Preferably, the pinned layer includes antiparallel (AP) coupled first and second ferromagnetic layers 118, 120 separated by an AP coupling layer 122. The first and second ferromagnetic pinned layers 118, 120 will hereafter be referred to as AP1 and AP2 respectively. The AP1 layer 118 and AP2 layer 120 have magnetizations that are pinned along an axis that is parallel with the easy axis of the free layer 108 as indicated by arrows 123 and 125. The magnetization of AP2 120 is strongly pinned through exchange coupling with an antiferromagnetic (AFM) material layer 124 formed adjacent to the pinned layer 116, and the antiparallel coupling keeps AP1 strongly pinned in the direction opposite AP2. While several antiferromagnetic materials would be suitable, such as for example FeMn or NiMn, the AFM layer 124 is preferably PtMn, which possesses a desirable combination of corrosion resistance, Curie temperature, and exchange coupling characteristics. While the preferred embodiment has been described as having an AP coupled pinned layer, those skilled in the art will recognize that a simple single pinned layer could be used as well.

The word line 104 passes above the MTJ cell 102, adjacent to and in electrical contact with the free layer 108 and in the same direction as the easy axis of the free layer. The bit line 106 passes beneath the MTJ cell 102, adjacent to and in electrical contact with the AFM layer, and runs along a direction that is perpendicular to the direction of the word line 104 and to the easy axis of magnetization of the free layer 108 and the pinned magnetic moments of the pinned layer 116. A thin insulating tunnel barrier layer 126 separates the free layer 108 from the pinned layer 116. The tunnel barrier layer 126 is constructed of an insulating material such as for example, alumina ($Al_2O_3$).

When the magnetic moments of the second ferromagnetic free layer 108 and AP1 118 are aligned in the same direction, the spins of electrons passing through these layers are in the same direction, which allows electrons to pass through the tunnel barrier 126 based on what is known as the tunnel valve effect. When the magnetic moment of the free layer 108 is opposite that of AP1, the electrons of each layer tend to have opposite spins, which renders them unable to pass easily through the tunnel layer 126. In other words, when the magnetic moments of free layer 108 and AP1 118 are in the same direction, the tunnel barrier layer 126 acts as a conductor and when the magnetic moments are opposite, the tunnel barrier 126 acts as an insulator. By applying a voltage across the tunnel junction cell 102 between its associated word line 104 and bit line 106, its resistance can be determined, thereby allowing the memory state of the tunnel junction cell 102 to be read.

Figure 3:
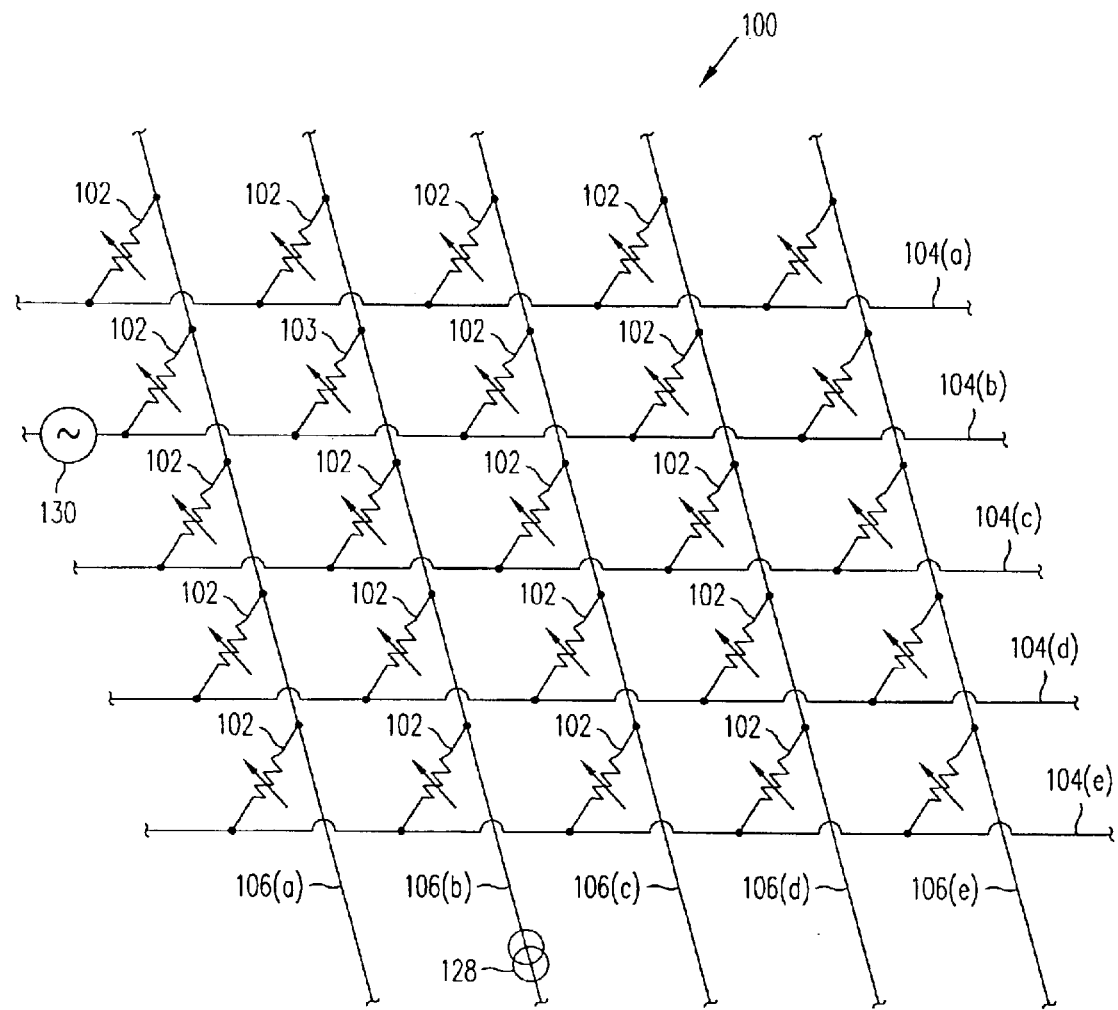
FIG. 3 is an electrical schematic view of a MRAM array according to an embodiment of the invention.
Figure 4A:
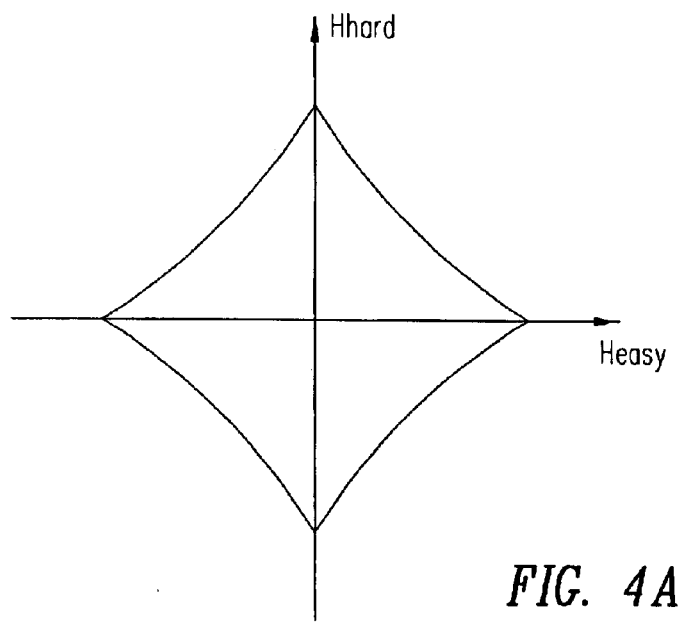
FIG. 4A is an ideal Stoner-Wohlfarth astroid curve for a single domain element.
Figure 4B:
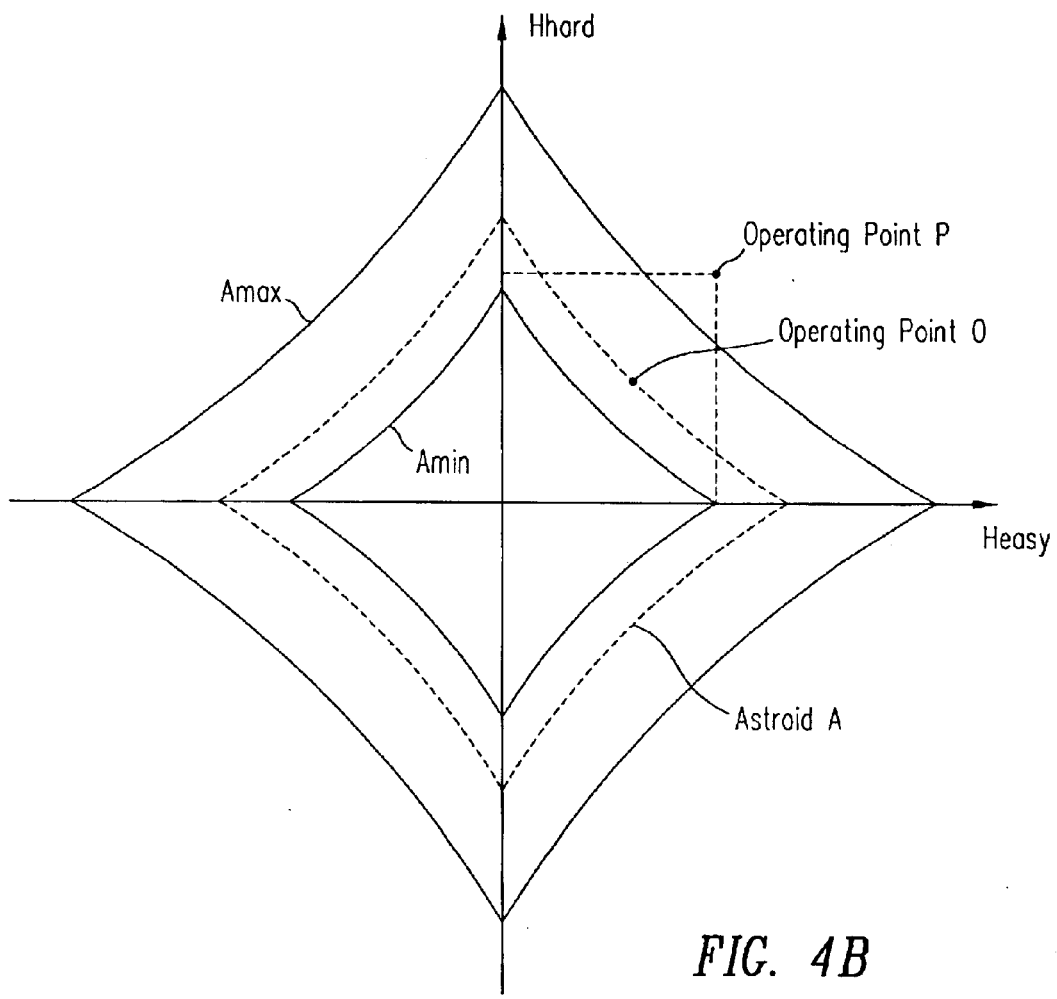
FIG. 4B is a set of astroid curves showing the distribution of switching fields in an MRAM array and possible operating points.

With reference now to FIG. 3, which shows an electrical schematic representation of the MRAM array 100, a DC current source 128 applies a DC current to a particular word line 106(b). The MTJ cells 102, 103, represented schematically as variable resistors, have inherent magnetic resonance frequencies associated with their free layers 108 (FIG. 3) which are a function of materials and geometry of the MTJ sensor. It should be appreciated that this will apply as well if another sort of magnetoresistive sensor is used, such as for example a CPP GMR. Since the MTJ sensors have essentially the same shape and material makeup, they will also have roughly the same inherent resonance frequency. The DC current generated by the DC source 128 creates a magnetic field that shifts the magnetic frequency of all of the MTJ cells associated with the particular word line 106(a), according to the function $$f_{FMR} = \frac{\gamma}{2\pi}\sqrt{4\pi M(H_{Keff} \pm H_{ext})}$$

Figure 5:
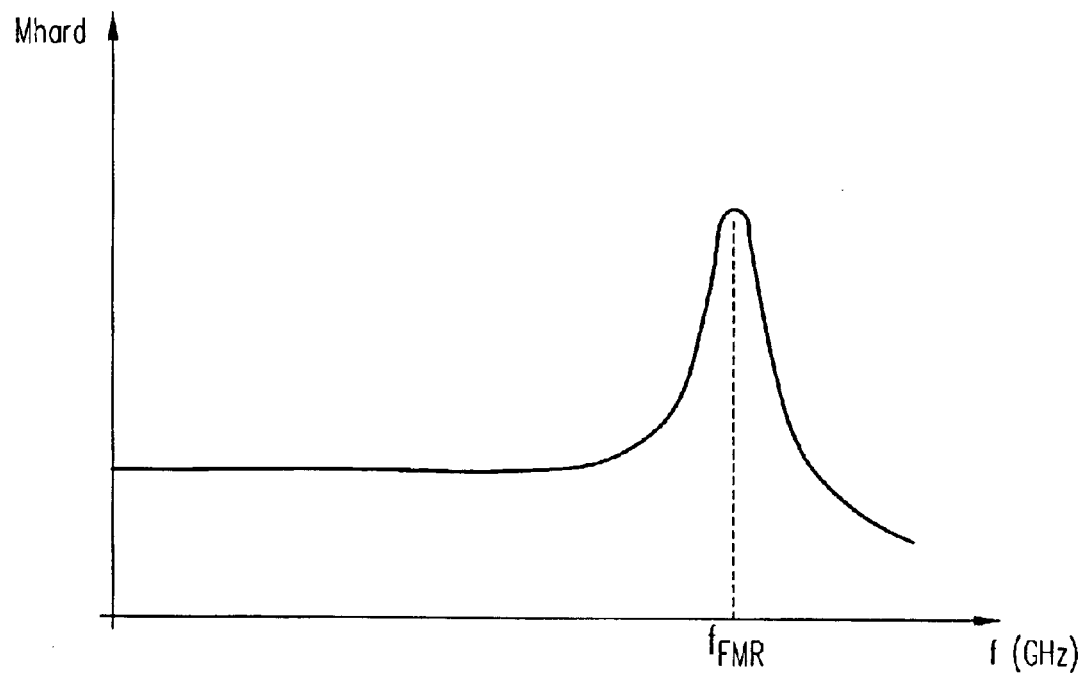
FIG. 5 is a typical ferromagnetic resonance response.
Figure 6:
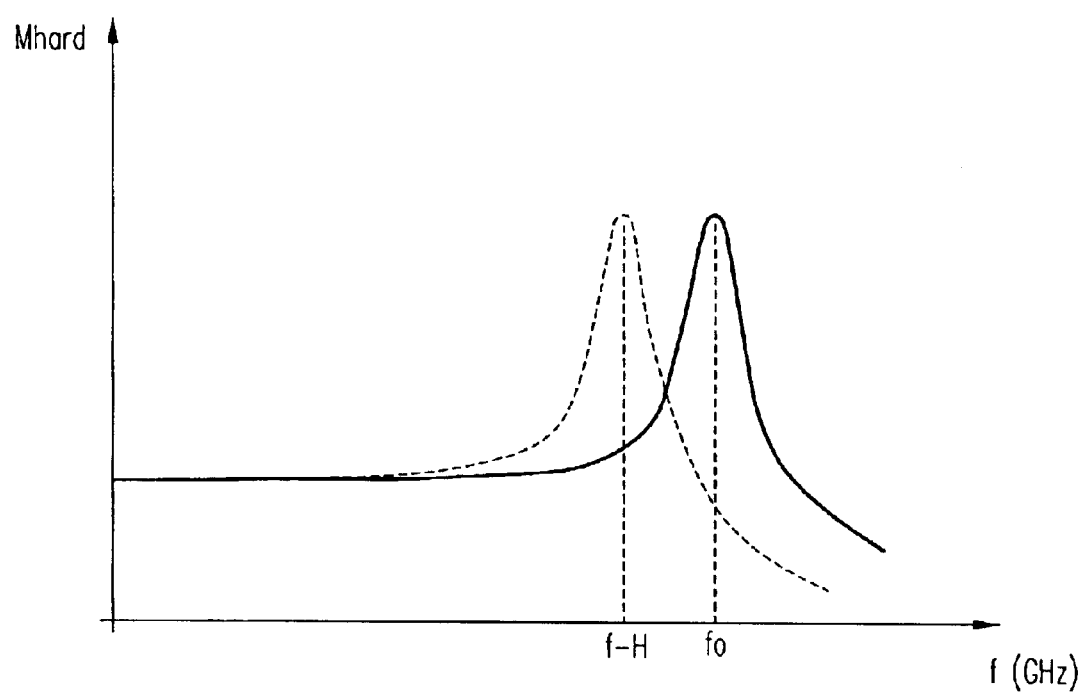
FIG. 6 is the zero field response and the shifted response in a field.
Figure 7:
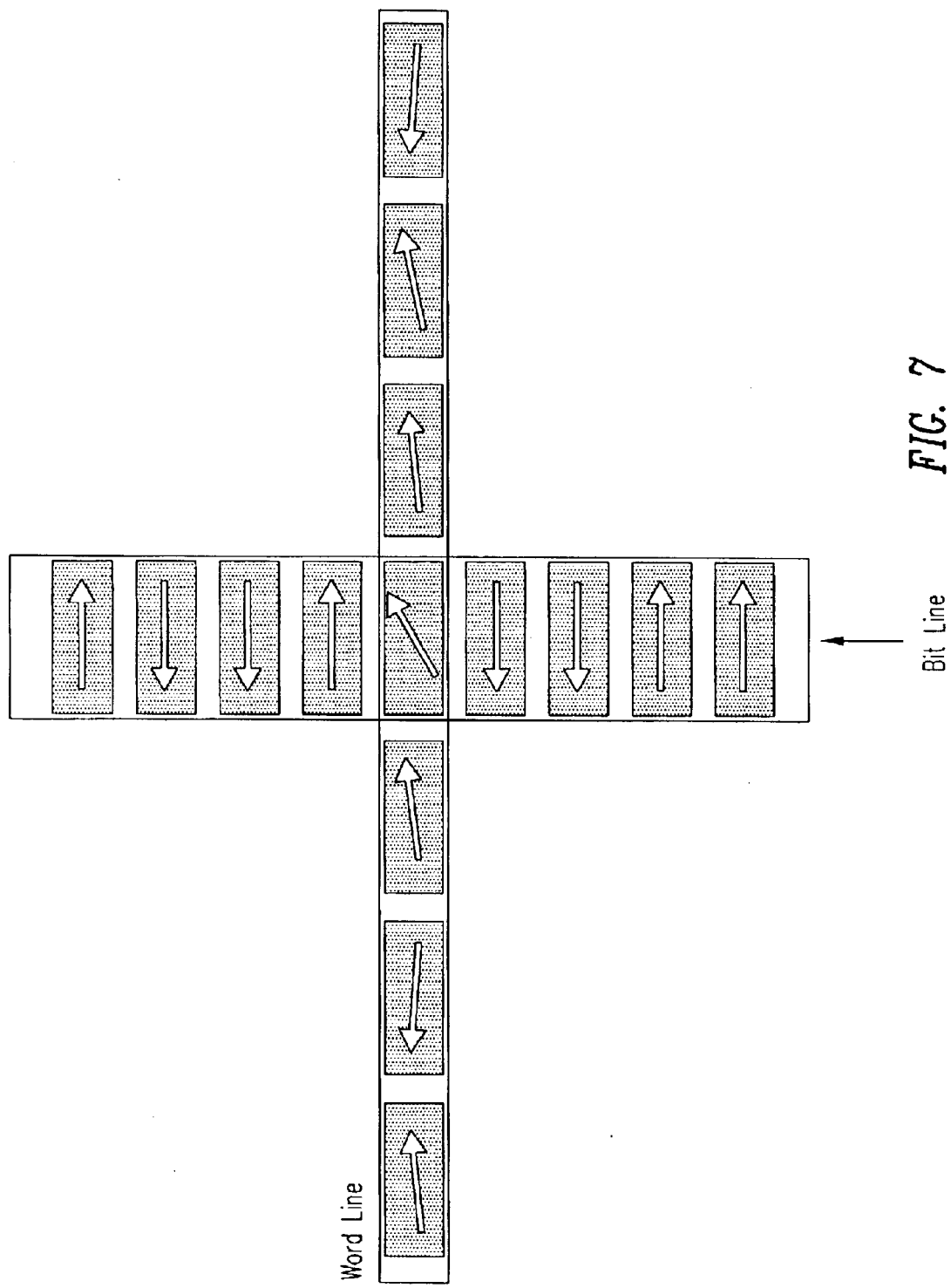
FIG. 7 is a representation of the magnetic states of the cells along the word and bit lines including the selected cell at the intersection.
Figure 8:
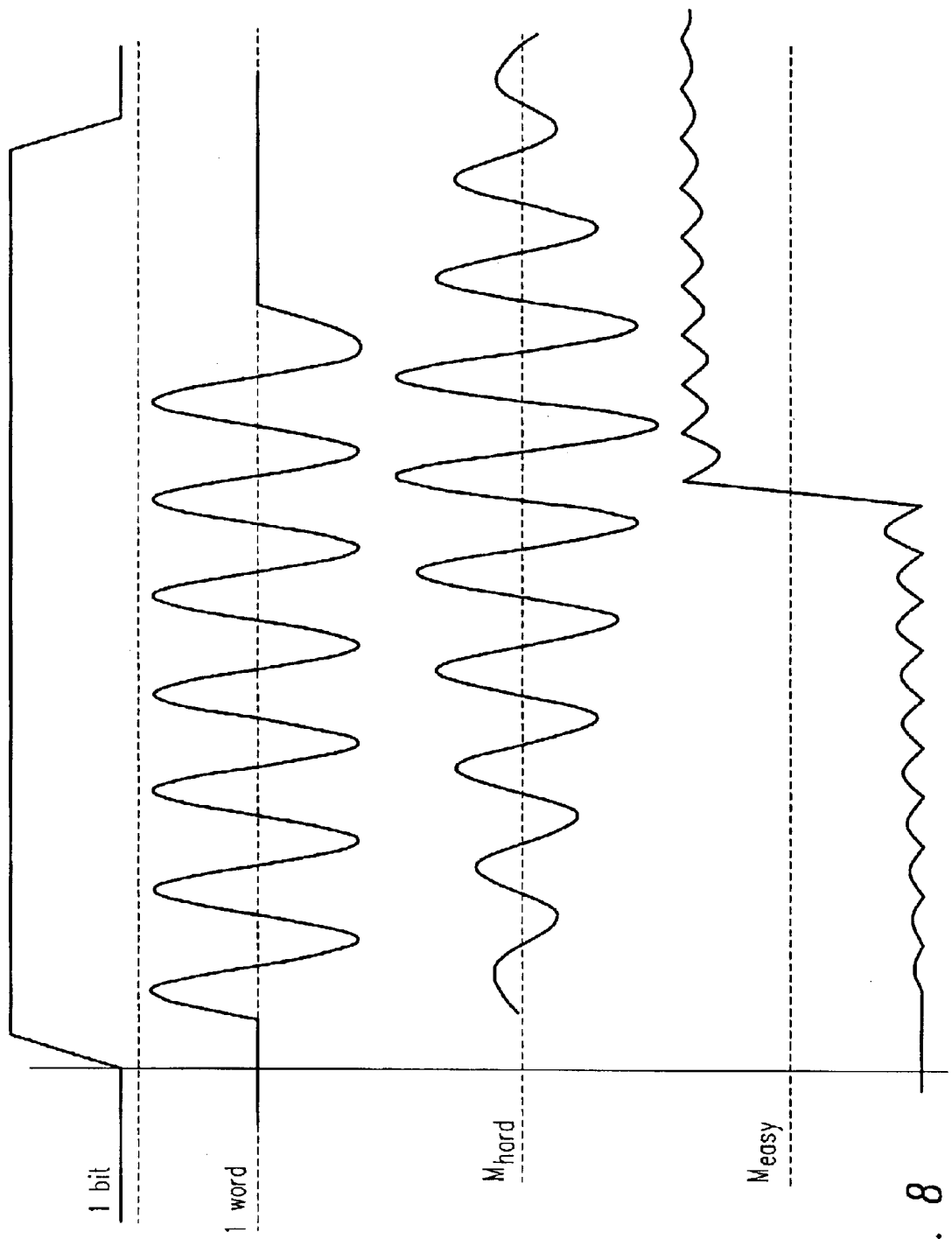
FIG. 8 is the timing diagram of the word and bit currents along with the magnetic response of the selected cell.

With reference to FIG. 3, which shows an electrical schematic representation of an MRAM array 100, the cells are read as in the prior art. The cells are written as in the prior art, but instead of DC currents being applied along both the word and bit lines, a DC current is applied to the bit line and an AC current at the ferromagnetic resonance frequency of the free layer is applied along the word line. With reference to FIG. 5, the magnetization rotation of the free layer will be maximum at the ferromagnetic resonance frequency. This rotation can be much larger than possible with a DC current of the same amplitude, thus requiring less power. Additionally, applying a DC current beforehand to the bit line, the resonance frequency of all the cells along the bit will be shifted from their zero field frequencies. If the polarity of the bit current is chosen such that the resultant magnetic field is opposite the magnetization direction of the free layer, the resonance frequency is shifted down from the zero field frequency, as shown in FIG. 6. In principle, the frequency can be shifted much farther down than it can be shifted up for the same field. With reference to FIG. 7, if the frequency of the word line is chosen to correspond to the shifted resonance frequency, the selected cell at the intersection with the bit line will oscillate at the shifted resonance frequency, the selected cell at the intersection with the bit line will oscillate at the shifted resonance frequency, resulting in large magnetization rotation. Meanwhile, other cells on the word line will oscillate with much smaller amplitude because they are driven off-resonance. The combination of a DC bit current and an AC word current provides greater selectivity than in prior art. FIG. 8 shows the details of exemplary timing of the bit and word lines along with the components of magnetization of the free layer. First, the DC current is applied to the bit line, and after a small delay corresponding to the rise time of the bit line current, the AC current is applied to the word one at the shifted resonance frequency of the AC current. With each successive period, the amplitude of the hard axis magnetization grows in amplitude and eventually, the torque on the free layer due to the bit field will switch the easy axis magnetization to the same direction as the bit field.

In an alternative embodiment of the present invention, the current in the bit line 106 could be initially generated in such a direction that the magnetic field induced by the current would be in the same direction as the initial magnetization of the free layer. Then after the AC current has been applied to the word line 104 at the resonance frequency of the cell 103, the current in the bit line 106 can be switched to flow in the opposite direction causing the free layer magnetization to flip. This alternate could provide improved timing of the switching, because the timing of the switching of the memory state of the cell 103 could be precisely controlled by the timing of the current switching in the bit line 106. However, this timing improvement could come at a cost of decreased speed.

An additional enhancement of the aforementioned embodiments includes a positive feedback circuit to tune the AC source to the shifted resonance frequency. This enhancement corrects for small variations in resonance frequency from cell to cell due to variations in the effective anisotropy of each cell. Initially, the selected cell is driven at a frequency close to the shifted resonance frequency, and the amplitude of the free layer oscillation is detected simultaneously by measuring the magnetoresistance of the cell. The amplitude signal is coupled back into a circuit providing positive feedback and gain, leading to sustained oscillations at the peak of the resonance curve. Such feedback circuits are well known in LC and quartz crystal oscillators.

It should be appreciated that the present invention has been described herein as the best embodiment contemplated and is by no means meant to be exhaustive. While the present invention has been particularly shown and described with reference to the preferred embodiments, it will be understood by those skilled in the art that various changes in form and detail may be made without departing form the spirit and scope of the invention. For example, while the invention has been described having MTJ cells with simple, single layer free layers, an MRAM array using MTJ cells with antiparallel coupled free and or simple single layer pinned layers could also incorporate the present invention. Furthermore, the invention could incorporate an antiparallel coupled free layer wherein the current from the word line passes through the center of the AP coupled free layer as described in commonly assigned patent application Ser. No. 10/263,495. In addition, the MRAM array could use giant magnetoresisitive (GMR) cells, or potentially some other magnetoresistive cell, rather than MTJ cells. Accordingly, the disclosed embodiments are considered to be merely illustrative and the invention should be limited in scope only by the appended claims.

What is claimed is:

1. A magnetic random access memory device, comprising:
   a magnetoresistive cell having a first resonance frequency;
   a first electrical line electrically connected with the magnetoresistive cell;
   a second electrical line electrically connected with the magnetoresistive cell;
   a first power source coupled with the first line to provide an electrical current through the first line to shift the resonance frequency of the magnetoresistive cell to a second resonance frequency;
   an AC power source coupled with the second electrical line, the AC power source generating a current having a frequency substantially equal to the shifted resonance frequency.

2. The magnetic random access memory as recited in claim 1 wherein the first power source is voltage source having a DC bias.

3. The magnetic random access memory as recited in claim 1 wherein the first power source is a current source having a DC bias.

4. The magnetic random access memory as recited in claim 1 wherein the magnetoresistive cell is a magnetic tunnel junction cell.

5. The magnetic random access memory as recited in claim 1 wherein the magnetoresistive cell is a giant magnetoresistive (GMR) cell.

6. The magnetic random access memory as recited in claim 1 wherein said first power source applies a DC current in a first direction, and switches to apply current in a second direction.

7. A magnetic random access memory device, comprising:
   a magnetoresistive cell having a first resonance frequency;
   means for shifting the resonance frequency to a second resonance frequency;
   means for supplying an alternating magnetic field adjacent to the magnetoresistive element, the alternating magnetic field having a frequency substantially equal to the second resonance frequency.

8. The magnetic random access memory as recited in claim 7, further comprising an electrical line disposed adjacent the magnetoresistive cell and wherein the means for shifting the resonance frequency of the magnetoresistive cell is a DC power source, coupled with the electrical line for generating a current therein.

9. The magnetic random access memory as recited in claim.7, further comprising a first electrical line disposed adjacent the magnetoresistive cell and a second electrical line disposed adjacent the magnetoresistive cell and substantially perpendicular to the first electrical line, and wherein the means for shifting the resonance frequency of the magnetoresistive cell is a first power source coupled with the first electrical line, and wherein the means for generating an alternating field is an AC second power source coupled with the second electrical line.

10. The magnetic random access memory as recited in claim 7, wherein the magnetoresistive cell is a magnetic tunnel junction cell.

11. The magnetic random access memory as recited in claim 7, wherein the magnetoresistive cell is a giant magnetoresistive (GMR) cell.

12. The magnetic random access memory as recited in claim 9 wherein the first power source is a current source with a DC bias.

13. The magnetic random access memory as recited in claim 9 wherein the first power source is a voltage source with a DC bias.

14. A method for switching a memory state in a magnetic random access memory having first and second electrically conductive lines electrically coupled to one another by a magnetoresistive cell having a first magnetic resonance frequency, the method comprising the step of:
   generating a current in the first line, the current generating a magnetic field to shift the magnetic resonance frequency of the magnetoresistive cell to a second resonance frequency; and
   generating an alternating current in the second electrically conductive line, the alternating current having a frequency substantially equal to the second resonance frequency.

15. The method as recited in claim 14, further comprising applying the current in a first direction along the first electrical line and switching the direction of the current to a second direction.

16. The method as recited in claim 14, wherein the current generated in the first electrical line has a DC component.

17. The method as recited in claim 14, wherein the magnetoresistive cell has a magnetic magnetically free layer with a net magnetic moment, and wherein the current generated in the first line has a DC component that generates a magnetic field in a direction to oppose the magnetic moment of the free layer.

* * * * *